United States Patent
Bold et al.

(10) Patent No.: US 10,791,646 B2
(45) Date of Patent: Sep. 29, 2020

(54) MULTI-DIRECTIONAL, LOW-PROFILE RACK MOUNTING SYSTEM

(71) Applicant: HEWLETT PACKARD ENTERPRISE DEVELOPMENT LP, Houston, TX (US)

(72) Inventors: Kevin Peter Bold, Houston, TX (US); Andrew Nathan Bulgerin, Cypress, TX (US); Minh H. Nguyen, Katy, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 29 days.

(21) Appl. No.: 16/176,677

(22) Filed: Oct. 31, 2018

(65) Prior Publication Data
US 2020/0137917 A1    Apr. 30, 2020

(51) Int. Cl.
*H05K 7/14* (2006.01)

(52) U.S. Cl.
CPC ......... *H05K 7/1489* (2013.01); *H05K 7/1492* (2013.01)

(58) Field of Classification Search
CPC .. H05K 7/1489; H05K 7/1492; H05K 7/1404; H05K 7/1491; H05K 7/1411; H05K 7/1487; H05K 7/1497; H05K 7/1414; H05K 7/1474; H05K 5/0208; H05K 5/0021; H05K 5/0065; H05K 5/0221; H05K 5/0204
See application file for complete search history.

(56) References Cited

U.S. PATENT DOCUMENTS

| | | | |
|---|---|---|---|
| 7,281,633 B2 | 10/2007 | Hartman | |
| 8,405,983 B2 | 3/2013 | Chen | |
| 9,281,676 B2* | 3/2016 | Chen | H05K 7/1491 |
| 9,775,260 B1* | 9/2017 | Warlick | H05K 7/1489 |
| 10,058,005 B1* | 8/2018 | Willard | H05K 7/1489 |
| 2008/0135705 A1* | 6/2008 | Chuang | H05K 7/1489 248/243 |
| 2010/0127141 A1* | 5/2010 | Chan | H05K 7/1492 248/220.22 |

(Continued)

OTHER PUBLICATIONS

APC PDU Mounting Brackets, CDW, Aug. 9, 2018, <https://www.cdw.com/product/apc-pdu-mounting-brackets/640893>.

(Continued)

*Primary Examiner* — Daniel P Wicklund
*Assistant Examiner* — Christopher L Augustin
(74) *Attorney, Agent, or Firm* — Hewlett Packard Enterprise Patent Department

(57) ABSTRACT

Systems and devices for mounting servers are provided. In one aspect, a rack mounting system includes a first mounting bracket attached to a rack. The rack comprises a rack front side and a rack rear side opposite the rack front side. The first mounting bracket is attached to the rack rear side. A rail bracket is attached to a server component mounted in the rack. A second mounting bracket comprises a first end and a second end. The first end is coupled to the first mounting bracket. The second end is coupled to the rail bracket. The second mounting bracket comprises a first surface and a second surface opposite the first surface. The first surface of the second mounting bracket contacts the first mounting bracket. The second surface of the second mounting bracket contacts the rail bracket.

17 Claims, 11 Drawing Sheets

(56) References Cited

U.S. PATENT DOCUMENTS

| | | | | |
|---|---|---|---|---|
| 2012/0252238 A1* | 10/2012 | Zhang | .................. | H05K 7/1411 |
| | | | | 439/153 |
| 2014/0021154 A1* | 1/2014 | Chen | .................... | H05K 7/1489 |
| | | | | 211/86.01 |
| 2014/0167576 A1* | 6/2014 | Tang | .................... | H05K 7/1489 |
| | | | | 312/223.1 |
| 2014/0332647 A1* | 11/2014 | Tai | ............................ | F16B 5/07 |
| | | | | 248/205.1 |
| 2015/0090677 A1* | 4/2015 | Shao | .................... | H05K 7/1489 |
| | | | | 211/26 |
| 2017/0332509 A1* | 11/2017 | Miyatsu | ................. | H05K 7/183 |
| 2019/0323629 A1* | 10/2019 | Chen | ........................ | F16L 3/015 |

OTHER PUBLICATIONS

Mounting an Ex4550 Switch on Four Posts in a Rack or Cabinet, Jul. 4, 2018, <https://www.juniper.net/documentation/en_US/release-independent/junos/topics/task/installation/ex4550-mounting-on-four-post-rack-or-cabinet.html >.

\* cited by examiner

MULTI-DIRECTIONAL, LOW-PROFILE RACK MOUNTING SYSTEM

TECHNICAL FIELD

The present disclosure generally relates to server racks, and more specifically relates to rack mounting system for server racks.

BACKGROUND

Server racks are typically box-like structures that houses a number of server components. Server components may include servers, switches, power supplies, routers, and the like. Server components mounted in server racks are periodically serviced which requires access to the server components. There is a need for rack mounting mechanism for mounting server components on server racks offering better accessibility to the server components for services.

The description provided in the background section should not be assumed to be prior art merely because it is mentioned in or associated with the background section. The background section may include information that describes one or more aspects of the subject technology.

SUMMARY

The disclosed system provides for mounting servers in server racks. A rack mounting system allows a server mounted in a server rack in a reverse direction in which the front of the server faces the rear side of the server rack to be removed and accessed from the rear side of the server rack without interfering with equipment on the rear side of the server rack. Baffles installed on the sides of the servers prevents hot air output from the server to mix with cold air that enters the server for cooling. By preventing the hot air to mix with the cold air, the server operates can operate properly without overheating. The disclosed system provides for efficient accessibility for servicing the server from the rear side of the rack while enhancing the cooling mechanism of the server.

According to certain aspects of the present disclosure, a rack mounting system is provided. The rack mounting system includes a first mounting bracket attached to a rack. The rack includes a rack front side and a rack rear side opposite the rack front side. The first mounting bracket is attached to the rack rear side. The rack mounting system also includes a rail bracket attached to a server component mounted in the rack. The rack mounting system further includes a second mounting bracket includes a first end and a second end. The first end is coupled to the first mounting bracket. The second end is coupled to the rail bracket. The second mounting bracket includes a first surface and a second surface opposite the first surface. The first surface of the second mounting bracket contacts the first mounting bracket. The second surface of the second mounting bracket contacts the rail bracket.

According to certain aspects of the present disclosure, a rack mounting device is provided. The rack mounting device includes a first mounting bracket attached to a rack. The rack includes a rack front side and a rack rear side opposite the rack front side. The first mounting bracket is attached to the rack rear side. The rack mounting device also includes a rail bracket attached to a server component mounted in the rack. The server component includes a component front side and a component rear side opposite the component front side. The server component is mounted in the rack such that the component front side faces the rack rear side and that the component rear side faces the rack front side. The rack mounting device further includes a second mounting bracket includes a first end and a second end. The first end is coupled to the first mounting bracket. The second end is coupled to the rail bracket. The second mounting bracket includes a first surface and a second surface opposite the first surface. The first surface of the second mounting bracket contacts the first mounting bracket. The second surface of the second mounting bracket contacts the rail bracket.

According to certain aspects of the present disclosure, a server rack system is provided. The server rack system includes a rack front side and a rack rear side opposite the rack front side. The server rack system also includes a rack mounting mechanism. The rack mounting mechanism includes a first mounting bracket attached to a rack. The rack includes a rack front side and a rack rear side opposite the rack front side. The first mounting bracket is attached to the rack rear side. The rack mounting mechanism also includes a rail bracket attached to a server component mounted in the rack. The rack mounting mechanism further includes a second mounting bracket includes a first end and a second end. The first end is coupled to the first mounting bracket. The second end is coupled to the rail bracket. The second mounting bracket includes a first surface and a second surface opposite the first surface. The first surface of the second mounting bracket contacts the first mounting bracket. The second surface of the second mounting bracket contacts the rail bracket.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Existing server racks house server components (e.g., servers, switches, routers, power supplies, etc.) that are horizontally stacked within the server racks. Server components are secured to the server racks in in a particular orientation in which I/O ports of the server components are accessible only from a front side of the server rack. However, this configuration may complicate access to one or more server components in the server rack.

The disclosed system provides for rack mounting system that allows server components to be mounted in the server racks in a reverse orientation to be accessible to provide a technician access to I/O ports, network cables, and the like of the server components and facilitate efficient removal of the server components from a rear side of the server rack without interfering with equipment attached the rear side of the server rack. The disclosed system provides for baffles to keep airflow of hot air produced by the server separated airflow of cold air for maintaining the server at operational temperature. The baffles are installed on the rack such that the baffles do not interfere with the server components during the removal of the server components from the server racks.

Example System Architecture

Figure 1:
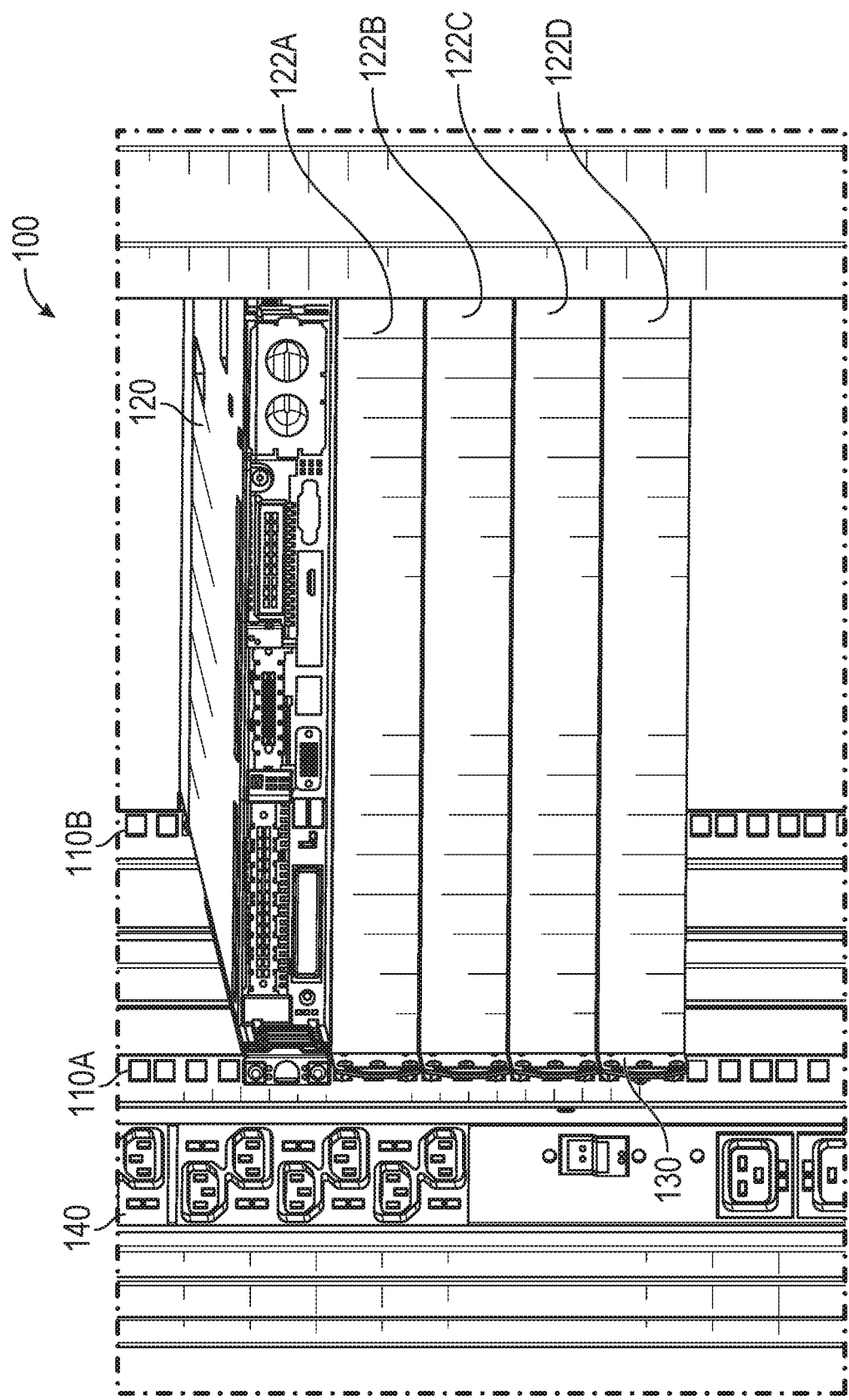
FIG. 1 illustrates an example rack system according to certain aspects of the disclosure.

FIG. 1 illustrates an example rack system 100 according to certain aspects of the disclosure. The rack system 100 may be a server rack. The rack system 100 includes vertical columns 110A and 110B, server components 120 and 122A-122D, a rack mounting system 130, and a power distribution unit (PDU) 140. For example, the rack system 100 may be a rectangular housing including vertical support posts (e.g., vertical columns 110A and 110B) positioned in respective corners of the rectangular housing. The vertical column 110A is disposed on a rear side (e.g., rack rear side) of the rack system 100. The vertical column 110B is disposed on a front side (e.g., rack front side) of the rack system 100.

The server components 120 and 122A-122D may include servers, switches, power supplies, and routers. The server components 120 and 122A-122D may be mounted in the rack system 100 by securing the front of the server components 120 and 122A-122D to the rear side of the rack system 100 and the rear of the server components 120 and 122A-122D to the front side of the rack system 100. The rack mounting system 130 attached to the server components 120 and 122A-122D allows the server components 120 and 122A-122D to be mounted in the rack system 100 such that the server components 120 and 122A-122D are accessible from the rear side of the server rack. For example, the rack mounting system 130 is attached to a side of a server component 122B towards the front of the server component 122B. The rack mounting system 130 attached to the server component 122B is attached to the vertical column 110A which is disposed on the rear side of the rack system 100. The rack mounting system 130 is spaced apart from the PDU 140 that is attached to the vertical column 110A.

According to an aspect of the present disclosure, the rack mounting system 130 allows one or more of the server components 122A-122D to be accessed and removed from the rear side of the rack system 100 without contacting the PDU 140 while one or more of the server components 122A-122D are also removable from the front side of the rack system 100. The rack mounting system 130 may include a rail bracket (e.g., rail bracket 132), a mounting bracket (e.g., mounting bracket 134 or integrated mounting bracket 136), and a tie-down bracket (e.g., tie-down bracket 138) will be discussed later in detail.

Figure 2:
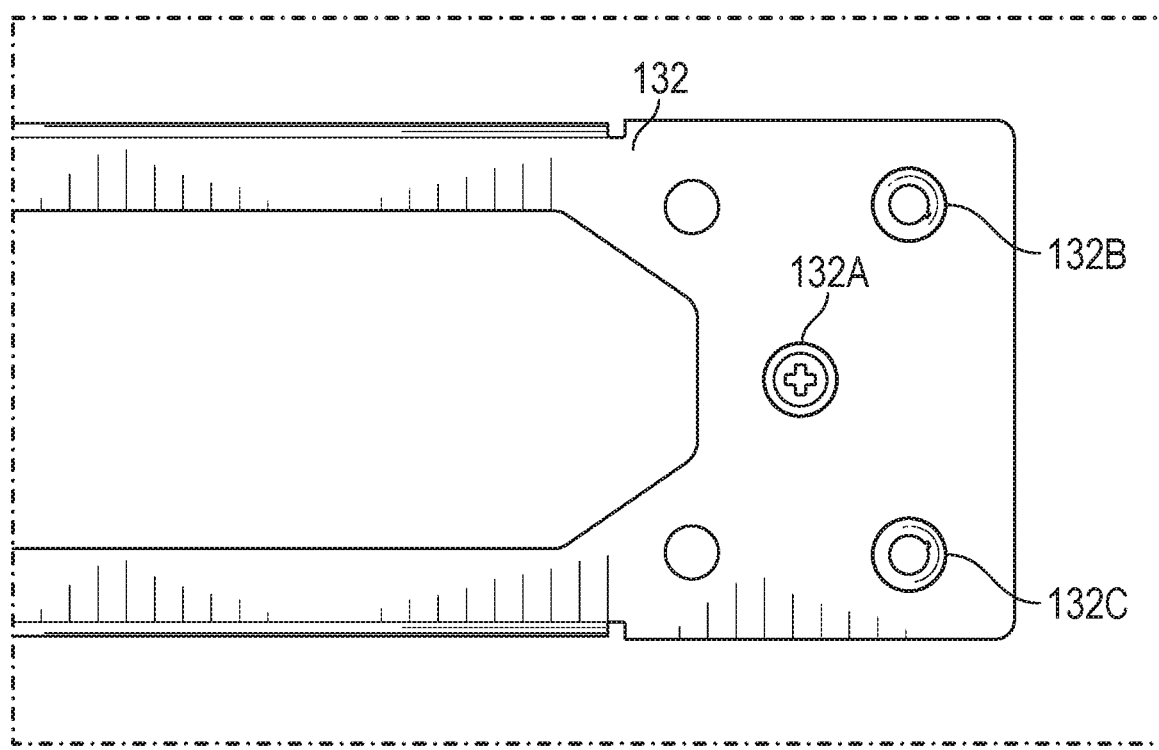
FIG. 2 illustrates a partial perspective view of a rail bracket from the rack mounting system of FIG. 1 according to certain aspects of the disclosure.

FIG. 2 illustrates a partial perspective view of a rail bracket 132 from the rack mounting system 130 of FIG. 1 according to certain aspects of the disclosure. The rail bracket 132 may be attached to a side of a server component (e.g., server component B). The rail bracket 132 may include an elongated body. The height of the rail bracket 132 may be similar to the height of a server component. One end of the rail bracket 132 may align with the front side of a sever component. The rail bracket 132 may include one or more screw holes on the elongated body. One or more screw holes may include a screw hole 132A for securing the rail bracket 132 to a server component (e.g., one of server components 120 and 122A-122D). One or more screw holes may include screw holes 132B and 132C for coupling a mounting bracket 134 to the rail bracket 132. The screw holes 132B and 132C are disposed closer to the front of the server component than the screw hole 132A. FIG. 2 illustrates three screw holes provided on the rail bracket 132, but the number of screw holes is not limited to three, and may be less or more than the number of screw holes shown in FIG. 2. It is understood these dimensions of the rail bracket 132 are exemplary only, and other sizes are possible.

Figure 3A:
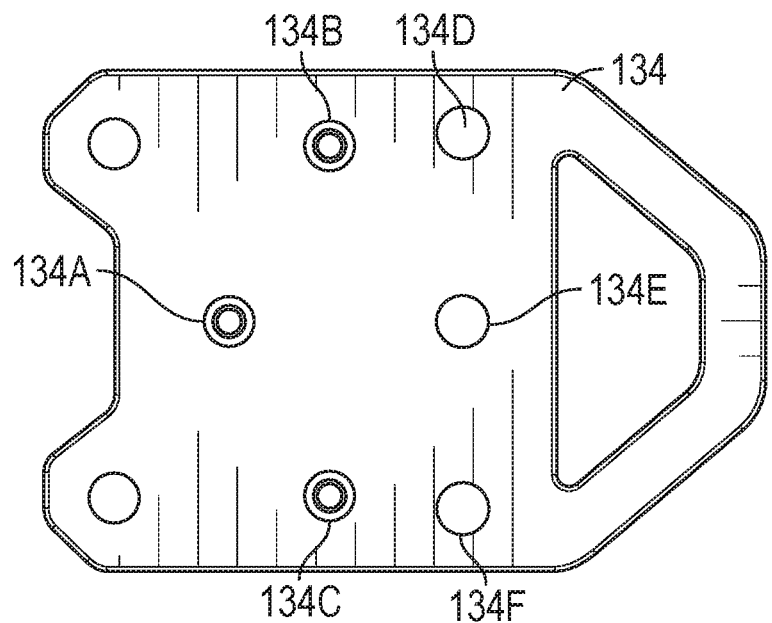
FIG. 3A illustrates a perspective view of a mounting bracket from the rack mounting system of FIG. 1 according to certain aspects of the disclosure.

FIG. 3A illustrates a perspective view of a mounting bracket 134 from the rack mounting system 130 of FIG. 1 according to certain aspects of the disclosure. The mounting bracket 134 (e.g., second bracket) may be attached to the rail bracket 132. The mounting bracket 134 may be a flat plate having a height similar to the height of the server component and the rail bracket 132. The mounting bracket 134 includes screw holes 134A-134F. When the mounting bracket 134 is attached to the rail bracket 132, the screw holes 134A, 134B, and 134C of the mounting bracket 134 align with the screw holes 132A, 132B, and 132C of the rail bracket 132, respectively. The screw holes 134A, 134B, and 134C may receive screw for securing the mounting bracket 134 onto the rail bracket 132 attached to the server component. The screw holes 134D, 134E, and 134F of the mounting bracket 134 may be used to attach the mounting bracket 134 to the tie-down bracket 138. One end of the mounting bracket 134 where the screw holes 134D, 134E, and 134F are disposed may extend beyond the front side of the server component. The mounting bracket 134 being a flat plate allows the server component to be accessible and removable from the rear side of the rack system 100 without interfering with equipment that may be attached to the rear side of the rack system 100. It is understood the number of screw holes on the mounting bracket 134 are exemplary only, and other number of screw holes are possible.

Figure 3B:
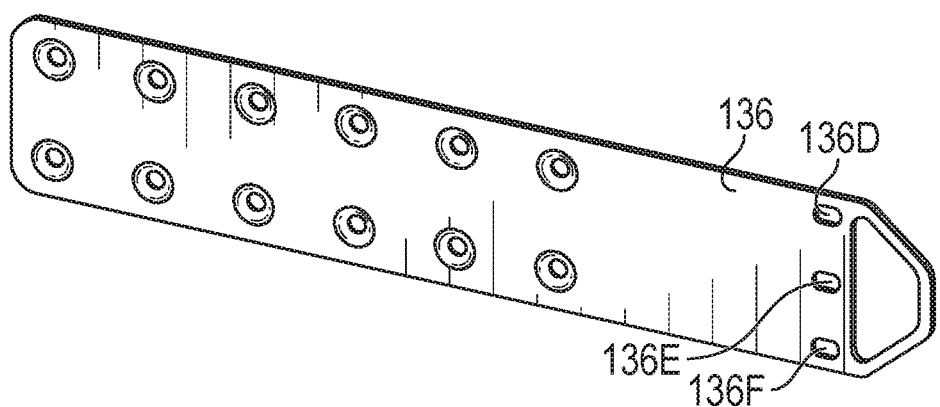
FIG. 3B illustrates a perspective view of a mounting bracket from the rack mounting system of FIG. 1 according to certain aspects of the disclosure.

FIG. 3B illustrates a perspective view of an integrated mounting bracket 136 from the rack mounting system 130 of FIG. 1 according to certain aspects of the disclosure. In some embodiments, the rail bracket 132 and the mounting bracket 134 may be replaced with the integrated mounting bracket 136. The integrated mounting bracket 136 is a flat plate having a height similar to the height of the server component. The integrated mounting bracket 136 may be attached directly onto a side of a server component. The integrated mounting bracket 136 includes screw holes 136D, 136E, and 136F for securing the integrated mounting bracket 136 to the tie-down bracket 138. In addition to the screw holes 136D, 136E, and 136F, the integrated mounting bracket 136 may include additional screw holes to secure the integrated mounting bracket 136 to the server component. One end of the integrated mounting bracket 136 where the screw holes 136D, 136E, and 136F are disposed may extend beyond the front side of the server component. The integrated mounting bracket 136 being a flat plate allows the server component to be accessible and removable from the rear side of the rack system 100 without interfering with equipment that may be attached to the rear side of the rack system 100. It is understood the number of screw holes on the integrated mounting bracket 136 are exemplary only, and other number of screw holes are possible.

Figure 4:
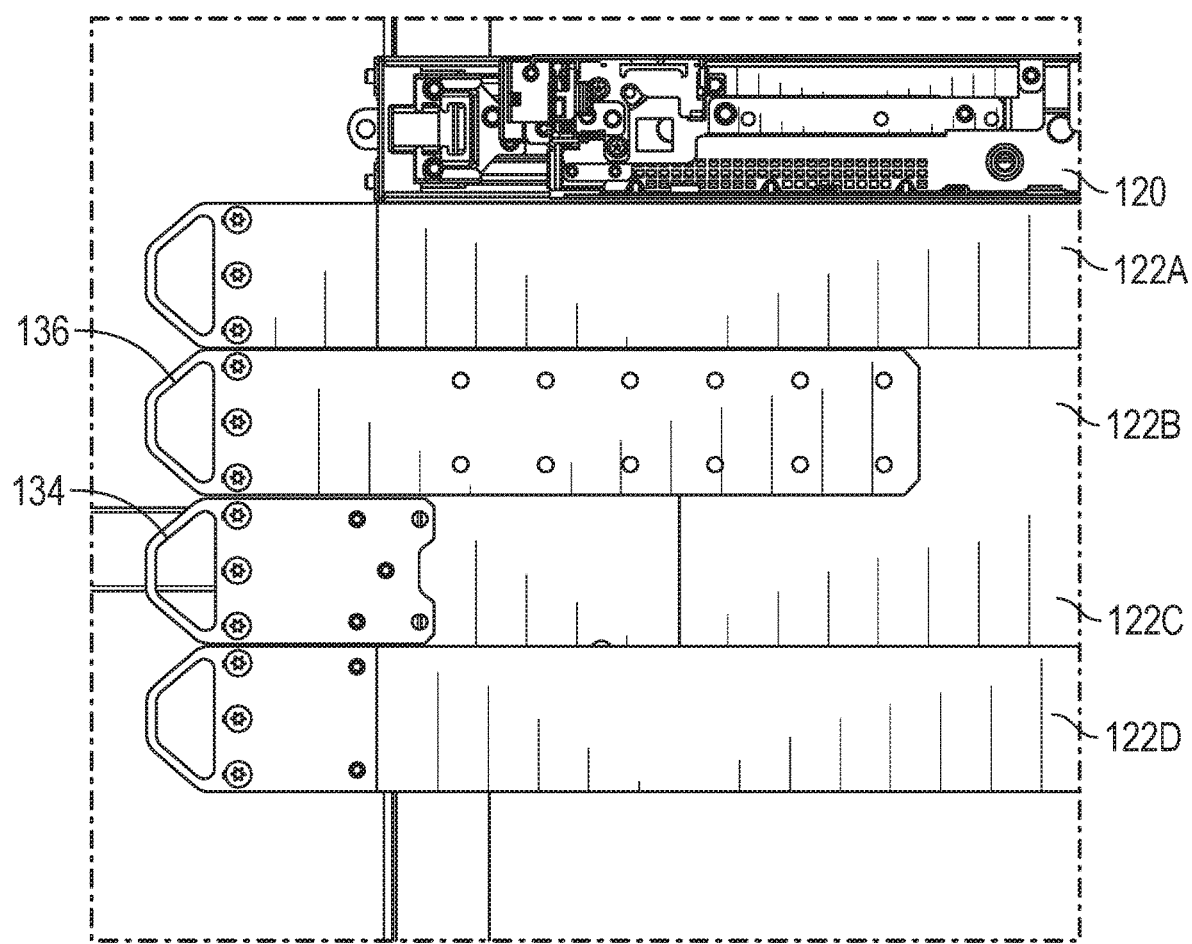
FIG. 4 illustrates a cross-sectional side view of the rack mounting system of FIG. 1 according to certain aspects of the disclosure.

FIG. 4 illustrates a cross-sectional side view of the rack mounting system 130 of FIG. 1 according to certain aspects of the disclosure. The server components 120 and 122A-122D are illustrated in FIG. 4. The front sides of the server components 120 and 122A-122D are on the left side of the FIG. 4. For example, the integrated mounting bracket 136 is directly attached to the server component 122B. The mounting bracket 134 is attached to the server component 122C via a rail bracket 132 (not shown). It is understood the combinations of the integrated mounting bracket 136 attached to the server component 122B and the mounting bracket 134 attached to the server component 122C are exemplary only, and other combinations, such as the integrated mounting bracket 136 attached to each of the server components 122A-122D or the mounting bracket 134 attached to each of the server components 122A-122D, are possible.

Figure 5:
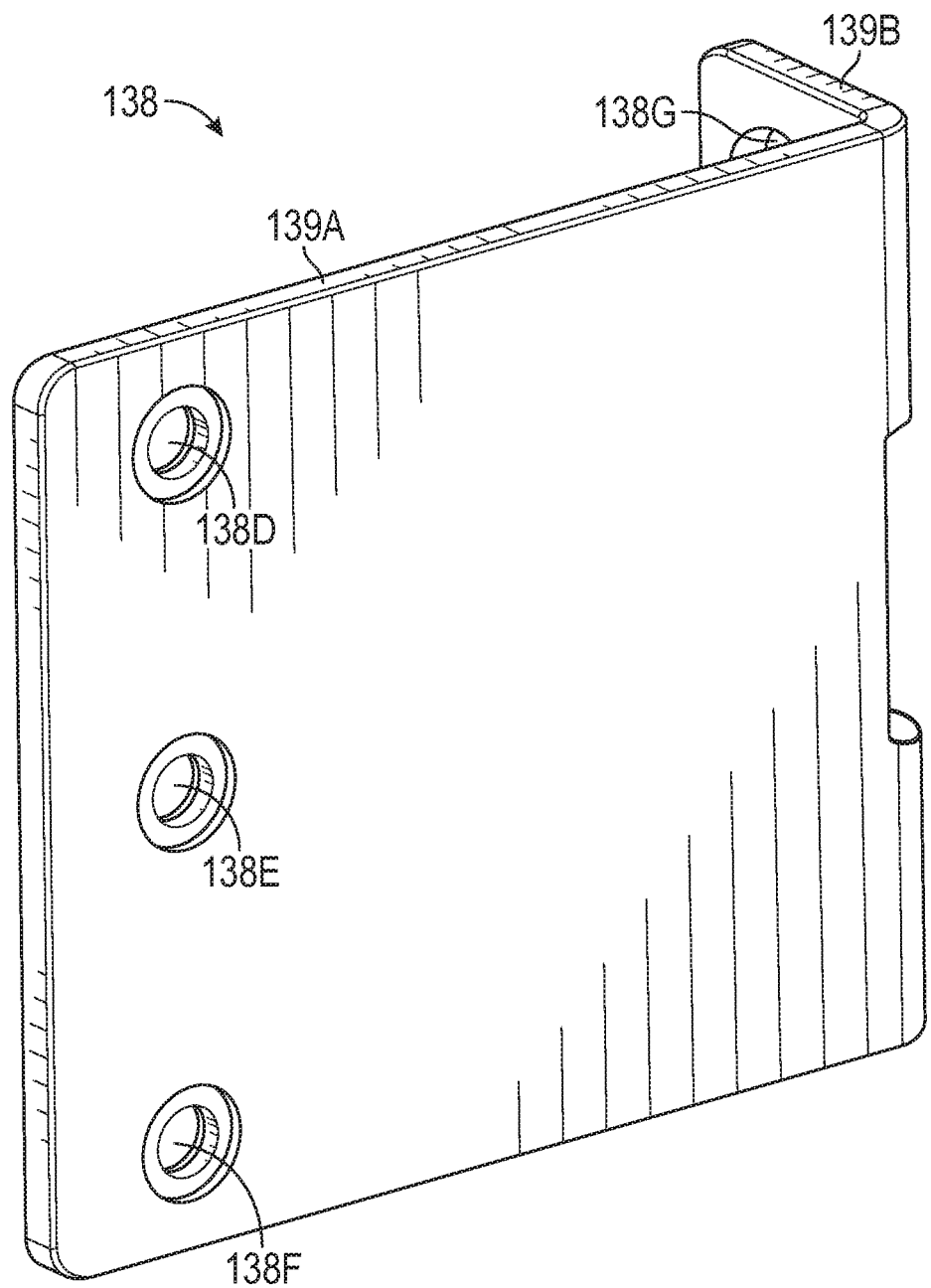
FIG. 5 illustrates a perspective view of a tie-down bracket from the rack mounting system of FIG. 1 according to certain aspects of the disclosure.

FIG. 5 illustrates a perspective view of a tie-down bracket 138 from the rack mounting system 130 of FIG. 1 according to certain aspects of the disclosure. The tie-down bracket 138 (e.g., first bracket) may be an L-shaped bracket having a first plate 139A and a second plate 139B extending from the first plate 139A. The first plate 139A includes screw holes 138D, 138E, and 138F for attaching the mounting bracket 134 or the integrated mounting bracket 136 onto the tie-down bracket 138. The second plate 139B includes a screw hole 138G for securing the tie-down bracket 138 to the vertical column 110A of the rack system 100. The first plate 139A includes a first surface and a second surface. For example, the second plate 139B extends out from the first surface of the first plate 139A. When the mounting bracket 134 or the integrated mounting bracket 136 is attached to the tie-down bracket 138, the mounting bracket 134 or the integrated mounting bracket 136 contacts the second surface of the first plate 139A. It is understood the numbers of screw holes on the first plate 139A and the second plate 139B are exemplary only, and other numbers of screw holes are possible.

Figure 6:
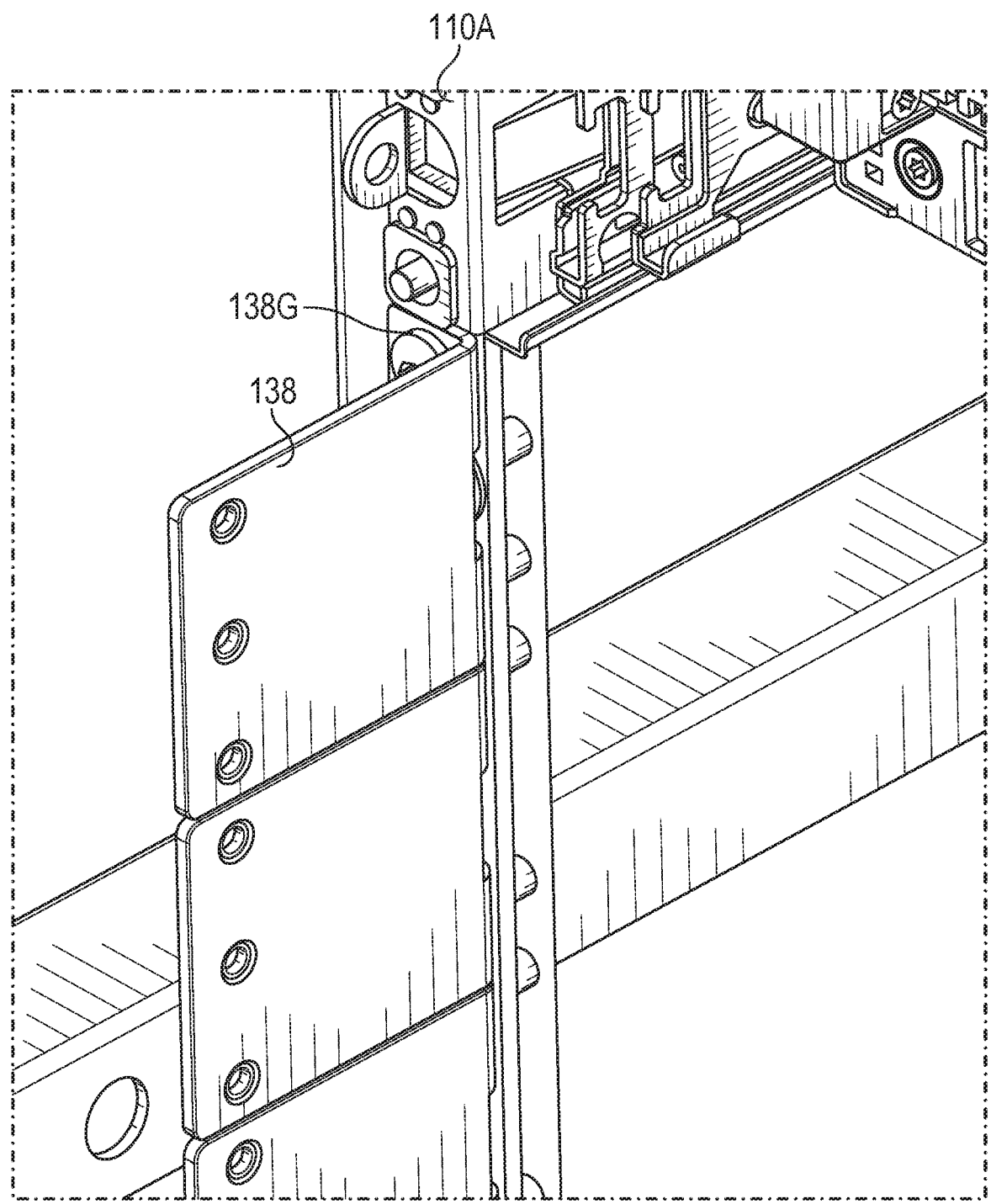
FIG. 6 illustrates an installation example of a tie-down bracket in a rack system of FIG. 1 according to certain aspects of the disclosure

FIG. 6 illustrates an installation example of a tie-down bracket 138 in the rack system 100 of FIG. 1 according to certain aspects of the disclosure. The tie-down bracket 138 is secured to the vertical column 110A via the screw hole 138G. For example, the second surface of the first plate 139A of the tie-down bracket 138 aligns with the inner side of the vertical column 110A.

Figure 7A:
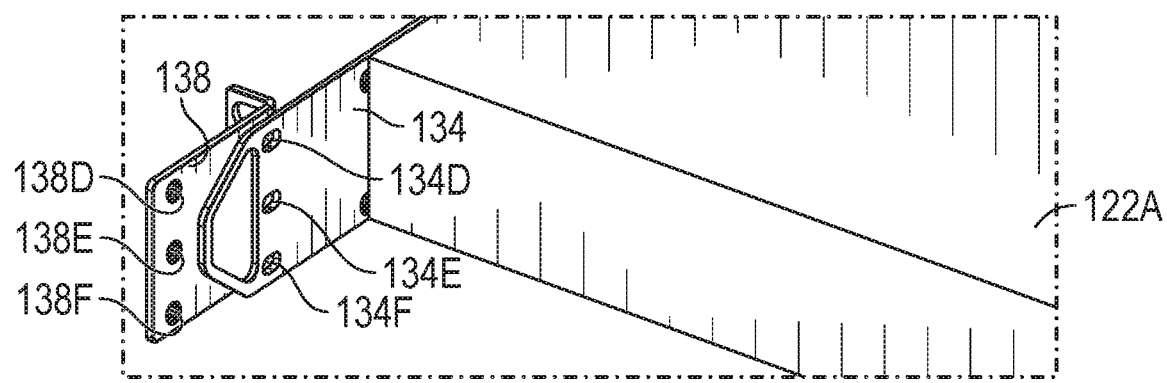
FIGS. 7A and 7B illustrate assembly examples of the rack mounting system of FIG. 1 according to certain aspects of the disclosure
Figure 7B:
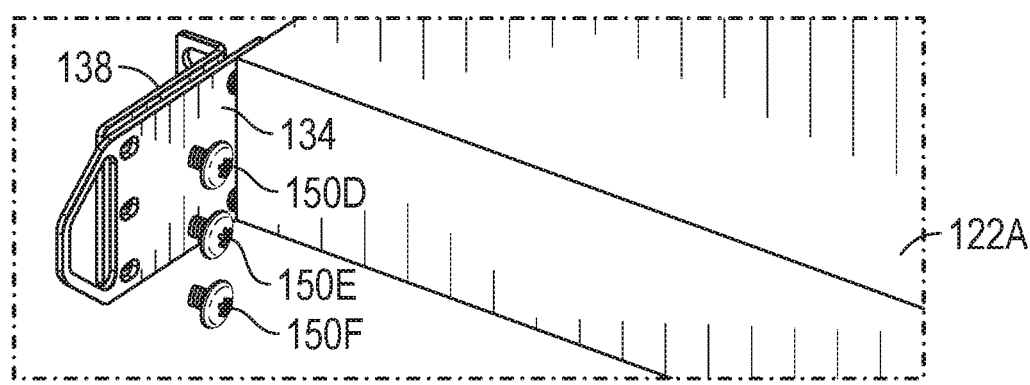

FIGS. 7A and 7B illustrate assembly examples of the rack mounting system 130 of FIG. 1 according to certain aspects of the disclosure. FIG. 7A illustrates a state in which the mounting bracket 134 attached to the server component 122A via the rail bracket 132 (not shown). The mounting bracket 134 is attached to the tie-down bracket 138 such that the surface of the mounting bracket 134 that faces away from the server component 122A contacts the first surface of the first plate 139A of the tie-down bracket 138. The screw holes 134D, 134E, and 134F of the mounting bracket 134 will be aligned with the screw holes 138D, 138E, and 138F of the tie-down bracket 138. FIG. 7B illustrates a state in which the screw holes 134D, 134E, and 134F of the mounting bracket 134 are aligned with the screw holes 138D, 138E, and 138F of the tie-down bracket 138. When the screw holes 134D, 134E, and 134F of the mounting bracket 134 are aligned with the screw holes 138D, 138E, and 138F of the tie-down bracket 138, the mounting bracket 134 attached to the server component 122A is secured onto the tie-down bracket 138 by placing screws 150D-150F to respective aligned screw holes.

Figure 8:
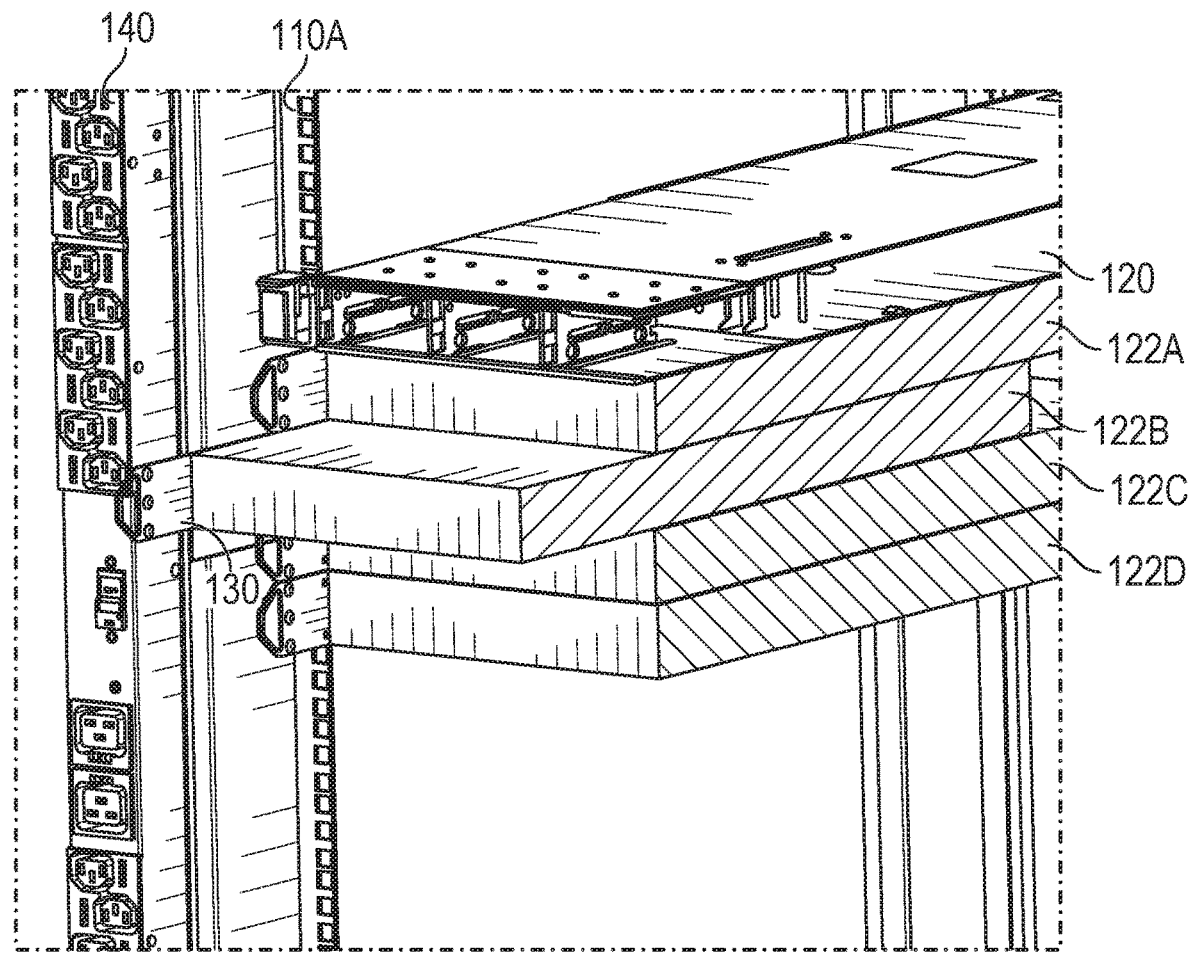
FIG. 8 illustrates an example of removal of a server component from the rack system of FIG. 1 according to certain aspects of the disclosure.

FIG. 8 illustrates an example of removal of a server component (e.g., server component 122B) from the rack system 100 of FIG. 1 according to certain aspects of the disclosure. The rack mounting system 130 is attached to each of the server components 122A-122D, and the rack mounting system 130 allows the server component to be mounted to the rack system via the vertical column 110A. The PDU 140 is attached to the vertical column 110A. For example, when the server component 122B to which the rack mounting system 130 is attached is removed from the rack system 100, the server component 122B is removed from the rack system 100 without interfering with the PDU 140 attached to the vertical column 110A of the rack system.

As described herein, advantages of the systems and devices includes providing access to server component in a server rack from multiple directions (e.g., the front side and the rear side of the server rack). For example, a rack mounting system used to mount the server component in a server rack prevents interference between the server component and equipment (e.g., PDU) on the server rack when removing the server component from the server rack to access the server component from the rear side of the server rack. By preventing the interference at the time of accessing the server component from the rear side of the server rack, the server component can be accessed from multiple directions. This configuration allows the server components to be well maintained since the server components are accessible from the front side and the back side of the server rack.

Figure 9A:
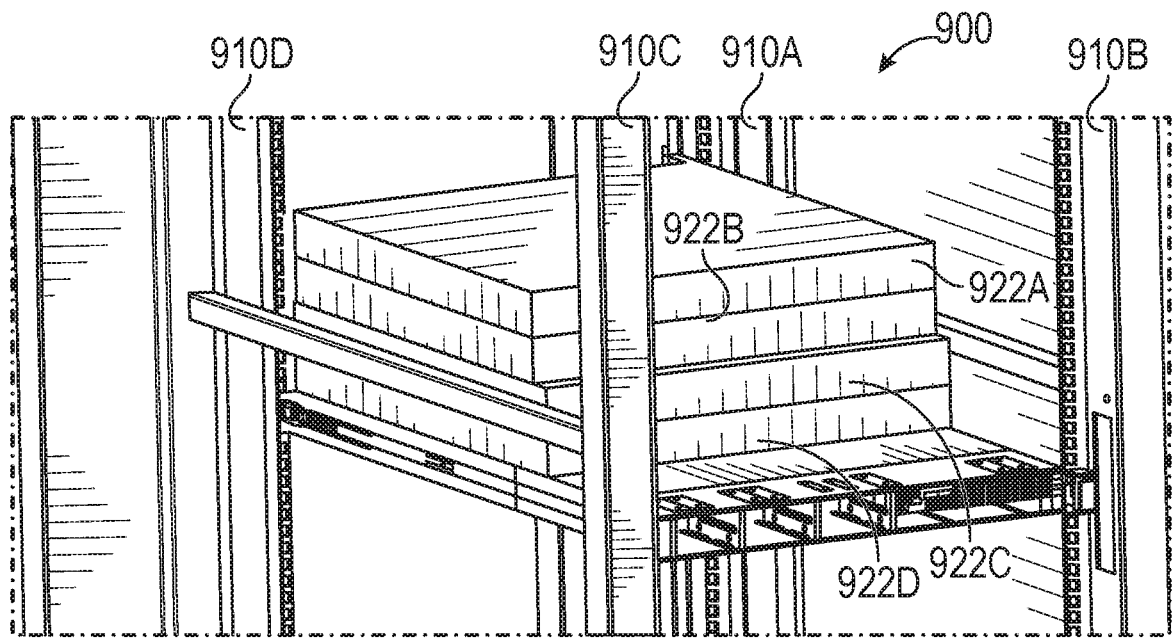
FIG. 9A illustrates an example of a conventional server rack according to prior art.

FIG. 9A illustrates an example server rack 900 according to certain aspects of the disclosure. For example, a server rack 900 includes vertical columns 910A-910D. The vertical columns 910A and 910D are disposed on the rear side of the server rack 900. The vertical columns 910B and 910C are disposed on the front side of the conventional server rack 900. The server components 922A-922D are mounted on the server rack 900. For example, the front sides of the server components 922A-922D face the front side of the server rack 900 and the rear sides of the server components 922A-922D face the rear side of the server rack 900.

Server components produce hot air while in operation, and server components need to intake cold air to cool the components in the server components to prevent server components from overheating. Server racks are placed in data centers such that one side (e.g., rear side) of a server rack faces a cold aisle, which has a cold air vent that allows cold air into the cold aisle of the data center, and the opposite side (e.g., front side) of the server rack faces a hot aisle which has a hot air vent that releases hot air outside the data center. However, for example, some of the airflow of hot air produced from the rear side of a server component may return through the sides of the server component to the front side of the server component where cold air is provided for consumption by the serve component. The hot air that returned to the front side mixes with the cold air and prevents a proper cooling of the server components 922A-922D.

Figure 9B:
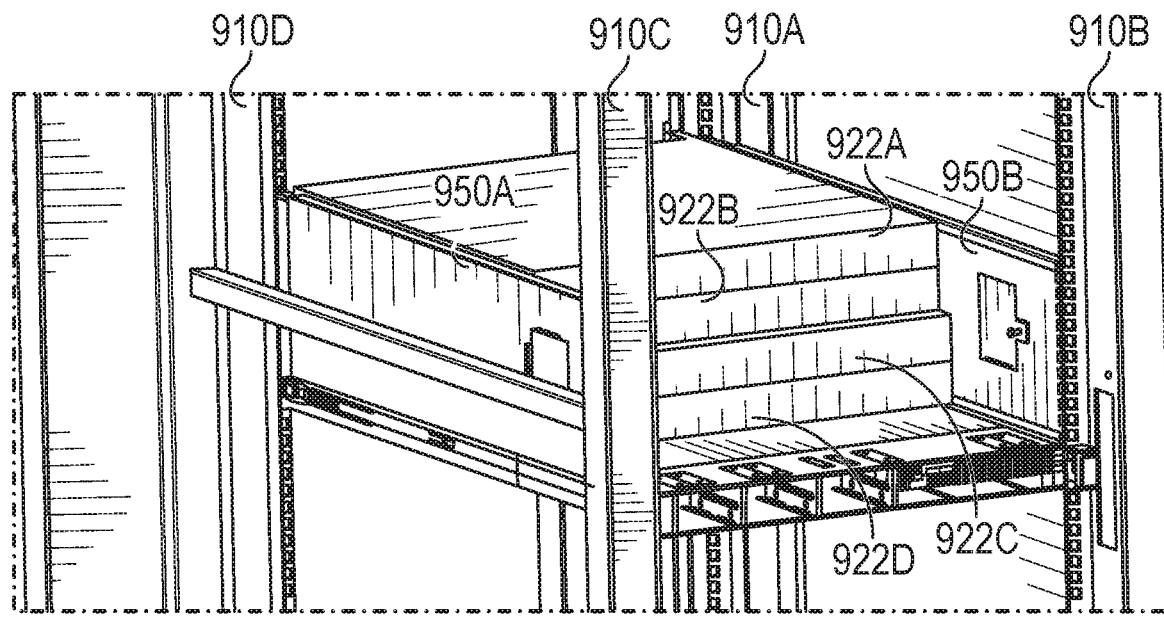
FIG. 9B illustrates an example server rack with an air baffle according to certain aspects of the disclosure.

FIG. 9B illustrates an example server rack with an air baffle according to certain aspects of the disclosure. To address the recirculation of hot air, baffles 950A and 950B are installed in the server rack 900. The baffle 950A is a flat plate that extends between the vertical columns 910D and 910C. The baffle 950B is a flat plate that extends between the vertical columns 910A and 910 B. The server components 922A-922D are placed between the baffles 950A and 950B. The hot air that returns through the sides of the server component towards the front side of a server component can be blocked by the baffles 950A and 950B. By providing the baffles 950A and 950B on the sides of the server components, the recirculation of the hot air is prevented allowing the server components to cool properly.

Figure 10A:
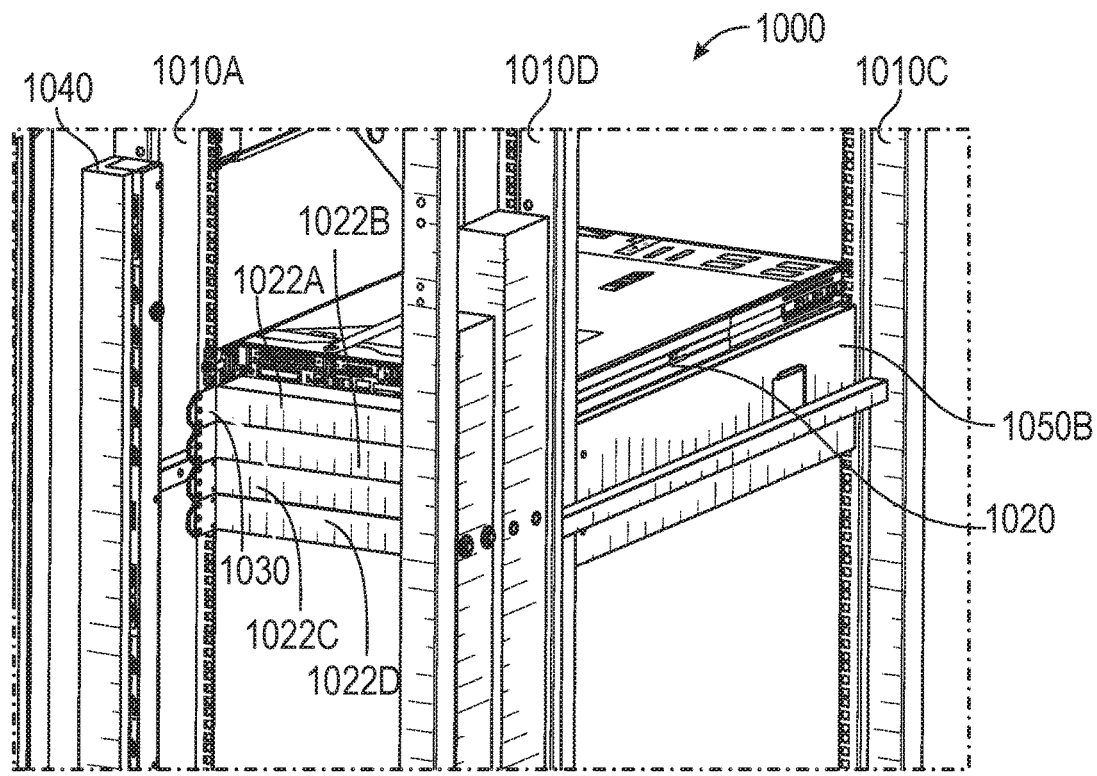
FIGS. 10A and 10B illustrate an example implementation of a rack mounting system and an air baffle according to certain aspects of the disclosure.
Figure 10B:
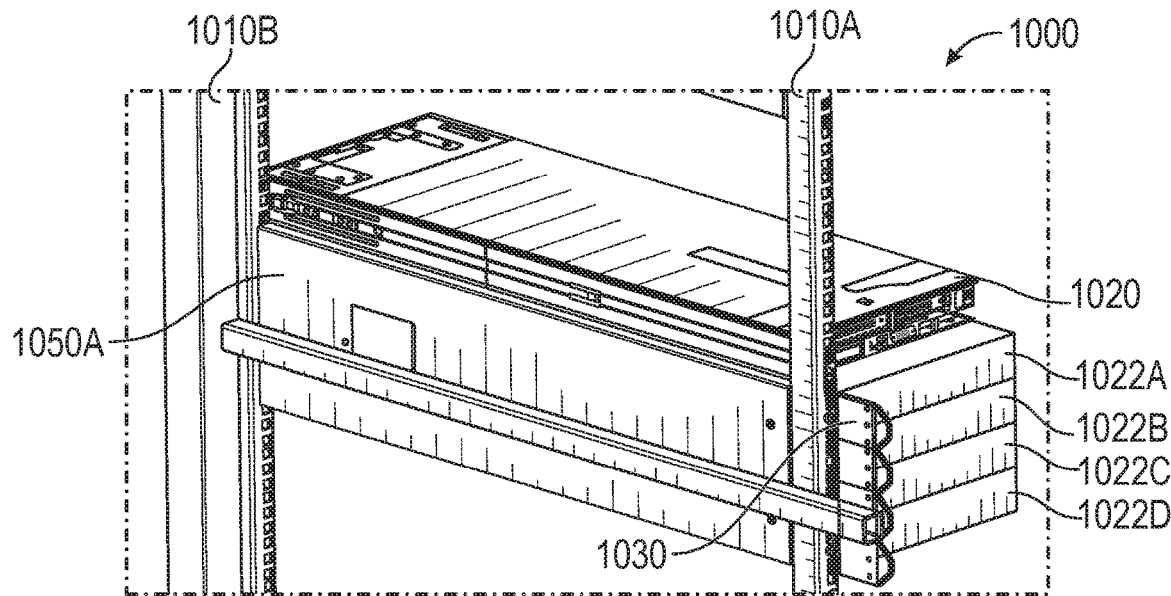

FIGS. 10A and 10B illustrate an example implementation of a rack mounting system 1030 and air baffle 1050B according to certain aspects of the disclosure. In FIG. 10A, the rack system 1000 includes vertical columns 1010A, 1010C, and 1010D. The rack system 1000 may also include a vertical column 1010B which is not shown in FIG. 10A. The vertical columns 1010A and 1010D are disposed on the rear side of the rack system 1000. The vertical columns 1010B and 1010C are disposed on the front side of the rack system 1000. The server components 1020 and 1022A-1022D are mounted in the rack system in a reverse direction using the rack mounting system 1030 as discussed above. For example the server components 1020 and 1022A-1022D are mounted in a reverse direction such that the front sides of the server components 1020 and 1022A-1022D face the rear side of the rack system 1000, and the rear sides of the server components 1020 and 1022A-1022D face the front side of the rack system 1000. The baffle 1050B extends between the vertical columns 1010D and 1010C. The thickness of the baffle 1050B does not extend towards the inner side of the rack system 1000 beyond the vertical columns 1010D and 1010C.

In FIG. 10B, the baffle 1050A extends between the vertical columns 1010A and 1010B. The baffle 1050A in FIG. 10B and 1050B in FIG. 10A do not extend outward beyond the vertical columns 1010A and 1010D disposed on the rear side of the rack system 1000. The baffle 1050A in FIG. 10B and 1050B in FIG. 10A do not extend outward beyond the vertical columns 1010B and 1010C disposed on the front side of the rack system 1000.

Figure 11A:
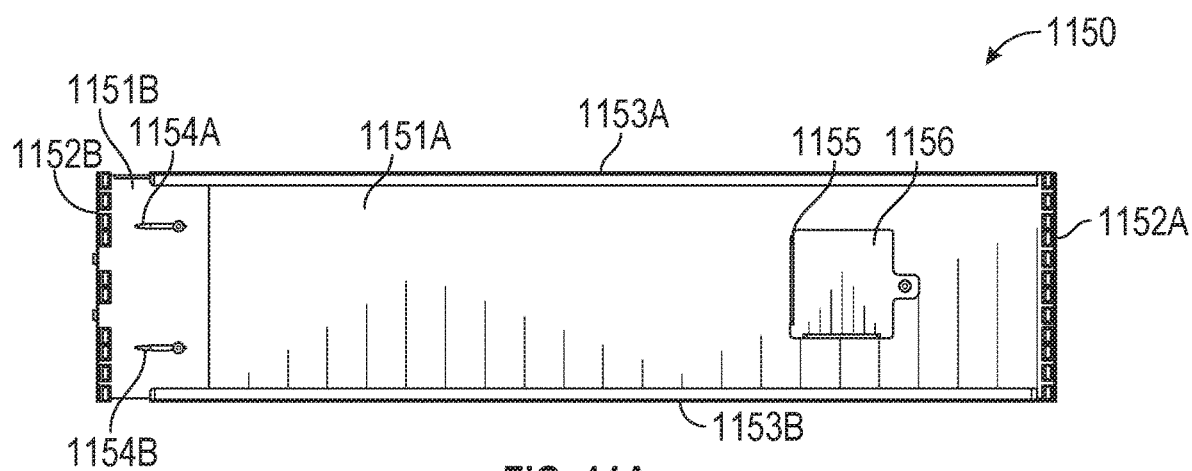
FIGS. 11A and 11B illustrate example air baffles according to certain aspects of the disclosure.
Figure 11B:
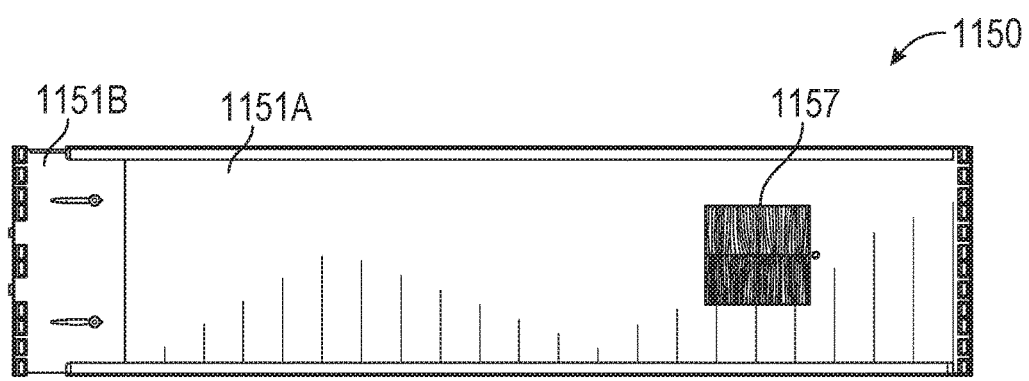

FIGS. 11A and 11B illustrate example baffles according to certain aspects of the disclosure. A baffle 1050 (e.g., 1050A or 1050B) is shown in FIG. 11A. The baffle 1050 includes a main plate 1151A and an adjustable plate 1151B. The main plate 1151A includes a first end 1152A that engages with a vertical column (e.g., vertical column 1010A) of a rack system (e.g., rack system 1000). The adjustable plate 1151B includes a second end 1152B that engages with another vertical column (e.g., vertical column B) of the rack system (e.g., rack system 1000). The main plate 1151A includes rails 1153A and 1153B extending from the first end 1152A towards and the second end 1152B. The rails 1153A and 1153B allows the adjustable plate 1151B to stay engaged with the main plate 1151A. The adjustable plate 1151B includes slits 1154A and 1154B. Screws 1155A and 1155B are disposed on the main plate 1151A and extend out of the slits 1154A and 1154B of the adjustable plate 1151B. The rails 1153A and 1153B allows the adjustable plate 1151B to slide along the slits 1154A and 1154B and in and out of the main plate 1151A allowing the length of the baffle 1050 to be adjusted based on the distance between two adjacent vertical columns onto which the baffle 1050 will be attached. The main plate 1151A may include an opening 1155 and a cover 1165 that covers the opening 1155. The opening 1155 allows power cables from a PDU on a vertical column to reach to a server component. The baffle 1050 shown in FIG. 11B is in a state in which the cover 1156 is removed and the opening 1155 is exposed. Opening 1155 includes brushes 1157. The brushes 1157 allows cables to go through the opening 1155 while keeping hot air from mixing with cold air and recirculating into the server component.

As described herein, advantages of the baffles include preventing recirculation of hot air. For example, the baffles disposed on the sides of server components shuts hot air to mix with the cold air for cooling the server components while not interfering with the server components during the removal of the server components from the rear side of the rack system. Therefore, the server components can be properly cooled to prevent overheating of the server components.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference. Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A rack mounting system comprising:
   a first mounting bracket attached to a rack, the rack comprising a rack front side and a rack rear side opposite the rack front side, the first mounting bracket being attached to the rack rear side,
   wherein the first mounting bracket is an L-shaped bracket comprising a first plate and a second plate,
   wherein the first plate extends perpendicularly from the second plate, and
   wherein the second plate protrudes outside the rack;
   a rail bracket attached to a server component mounted in the rack; and
   a second mounting bracket comprising a first end and a second end, the first end coupled to the first mounting bracket, the second end coupled to the rail bracket,
   wherein the second mounting bracket comprises a single flat bracket including a first surface and a second surface opposite the first surface, the first surface of the second mounting bracket contacting the first mounting bracket, the second surface of the second mounting bracket contacting the rail bracket.

2. The rack mounting system of claim 1, wherein the first plate comprising a first surface and a second surface opposite the first surface,
   wherein the second plate comprising a first surface and a second surface opposite the first surface,
   wherein the first surface of the first plate faces the first surface of the second plate,
   wherein the second surface of the first plate contacts the rack, and
   wherein the second surface of the second plate contacts the second surface of the second mounting bracket.

3. The rack mounting system of claim 1, wherein entirety of the second mounting bracket is parallel to the rail bracket and the second plate of the first mounting bracket.

4. The rack mounting system of claim 1, wherein the server component comprises a component front side and a component rear side opposite the component front side, and
wherein the server component is mounted in the rack such that the component front side faces the rack rear side and that the component rear side faces the rack front side.

5. The rack mounting system of claim 1, further comprising a rack power distribution unit (PDU) attached to the rack rear side of the rack.

6. The rack mounting system of claim 5, wherein, when the server component slides out from the rack rear side of the rack, the server component slides out from the rack rear side of the rack without contacting the PDU.

7. A rack mounting device comprising:
a first mounting bracket attached to a rack, the rack comprising a rack front side and a rack rear side opposite the rack front side, the first mounting bracket being attached to the rack rear side,
wherein the first mounting bracket is an L-shaped bracket comprising a first plate and a second plate,
wherein the first plate extends perpendicularly from the second plate, and
wherein the second plate protrudes outside the rack;
a rail bracket attached to a server component mounted in the rack, the server component comprising a component front side and a component rear side opposite the component front side, the server component being mounted in the rack such that the component front side faces the rack rear side and that the component rear side faces the rack front side; and
a second mounting bracket comprising a first end and a second end, the first end coupled to the first mounting bracket, the second end coupled to the rail bracket,
wherein the second mounting bracket comprises a single flat bracket including a first surface and a second surface opposite the first surface, the first surface of the second mounting bracket contacting the first mounting bracket, the second surface of the second mounting bracket contacting the rail bracket.

8. The rack mounting device of claim 7, wherein the first plate comprising a first surface and a second surface opposite the first surface,
wherein the second plate comprising a first surface and a second surface opposite the first surface,
wherein the first surface of the first plate faces the first surface of the second plate,
wherein the second surface of the first plate contacts the rack, and
wherein the second surface of the second plate contacts the second surface of the second mounting bracket.

9. The rack mounting device of claim 7, wherein entirety of the second mounting bracket is parallel to the rail bracket and the second plate of the first mounting bracket.

10. The rack mounting device of claim 7, further comprising a rack power distribution unit (PDU) attached to the rack rear side of the rack.

11. The rack mounting device of claim 10, wherein, when the server component slides out from the rack rear side of the rack, the server component slides out from the rack rear side of the rack without contacting the PDU.

12. A server rack system comprising:
a rack front side and a rack rear side opposite the rack front side; and
a rack mounting mechanism comprising:
a first mounting bracket attached to the rack rear side, wherein the first mounting bracket is an L-shaped bracket comprising a first plate and a second plate, wherein the first plate extends perpendicularly from the second plate, and wherein the second plate protrudes outside the rack;
a rail bracket attached to a server component mounted in the rack; and
a second mounting bracket comprising a first end and a second end, the first end coupled to the first mounting bracket, the second end coupled to the rail bracket,
wherein the second mounting bracket comprises a single flat bracket including a first surface and a second surface opposite the first surface, the first surface of the second mounting bracket contacting the first mounting bracket, the second surface of the second mounting bracket contacting the rail bracket.

13. The server rack system of claim 12, wherein the first plate comprising a first surface and a second surface opposite the first surface,
wherein the second plate comprising a first surface and a second surface opposite the first surface,
wherein the first surface of the first plate faces the first surface of the second plate,
wherein the second surface of the first plate contacts the rack, and
wherein the second surface of the second plate contacts the second surface of the second mounting bracket.

14. The server rack system of claim 12, wherein entirety of the second mounting bracket is parallel to the rail bracket and the second plate of the first mounting bracket.

15. The server rack system of claim 12, wherein the server component comprises a component front side and a component rear side opposite the component front side, and
wherein the server component is mounted in the rack such that the component front side faces the rack rear side and that the component rear side faces the rack front side.

16. The server rack system of claim 12, further comprising a rack power distribution unit (PDU) attached to the rack rear side.

17. The server rack system of claim 16, wherein, when the server component slides out from the rack rear side of the rack, the server component slides out from the rack rear side of the rack without contacting the PDU.

* * * * *